(12) United States Patent
Larsen et al.

(10) Patent No.: US 8,994,371 B2
(45) Date of Patent: Mar. 31, 2015

(54) PHASE DETECTION IN AN ATOMIC SENSING SYSTEM

(75) Inventors: Michael S. Larsen, Woodland Hills, CA (US); Robert Griffith, Newhall, CA (US); Michael D. Bulatowicz, Canoga Park, CA (US); Philip R. Clark, Tarzana, CA (US)

(73) Assignee: Northrop Grumman Guidance and Electronics Company, Inc., Woodland Hills, CA (US)

( * ) Notice: Subject to any disclaimer, the term of this patent is extended or adjusted under 35 U.S.C. 154(b) by 597 days.

(21) Appl. No.: 13/332,536

(22) Filed: Dec. 21, 2011

(65) Prior Publication Data

US 2012/0182011 A1 Jul. 19, 2012

Related U.S. Application Data

(60) Provisional application No. 61/432,325, filed on Jan. 13, 2011.

(51) Int. Cl.
*G01V 3/00* (2006.01)
*G01R 33/00* (2006.01)
*G01R 33/12* (2006.01)

(52) U.S. Cl.
CPC ........ *G01R 33/0041* (2013.01); *G01R 33/1284* (2013.01)
USPC .......................................... 324/304; 324/301

(58) Field of Classification Search
USPC ................................................ 324/300–305
See application file for complete search history.

(56) References Cited

U.S. PATENT DOCUMENTS

| | | | | |
|---|---|---|---|---|
| 3,778,700 A | * | 12/1973 | Bayley et al. | 324/304 |
| 3,839,670 A | * | 10/1974 | Usher | 324/301 |
| 4,157,495 A | | 6/1979 | Grover et al. | |
| 7,183,768 B2 | | 2/2007 | Min | |
| 8,054,073 B2 | * | 11/2011 | Tuchman | 324/301 |
| 8,600,691 B2 | * | 12/2013 | Griffith et al. | 702/92 |
| 2005/0150295 A1 | | 7/2005 | Wright | |
| 2006/0132130 A1 | | 6/2006 | Abbink et al. | |
| 2010/0007345 A1 | | 1/2010 | Kanegsberg | |
| 2010/0264921 A1 | | 10/2010 | Horng et al. | |
| 2010/0327865 A1 | | 12/2010 | Nagasaka | |

OTHER PUBLICATIONS

International Search Report for corresponding PCT/US12/21292, completed May 8, 2012 by Lee W. Young of the ISA/US.

* cited by examiner

*Primary Examiner* — Louis Arana
(74) *Attorney, Agent, or Firm* — Tarolli, Sundheim, Covell & Tummino LLP

(57) ABSTRACT

One embodiment of the invention includes an atomic sensing system. The system includes an atomic sensing device configured to generate an output signal along an output axis in response to a plurality of control parameters. The system also includes a signal generator configured to apply a reference signal to a cross-axis that is approximately orthogonal to the output axis. The system also includes a phase measurement system configured to demodulate the output signal relative to the reference signal to measure a relative phase alignment between the output axis and a physical axis of the atomic sensing device based on the reference signal.

19 Claims, 4 Drawing Sheets

PHASE DETECTION IN AN ATOMIC SENSING SYSTEM

CROSS REFERENCE TO RELATED APPLICATION

The present application claims filing benefit of U.S. Provisional Application No. 61/432,325 having a filing date of Jan. 13, 2011, which is incorporated herein by reference in its entirety.

This invention was made with Government support under Contract No. N66001-05-C-8083. The Government has certain rights in this invention.

TECHNICAL FIELD

The present invention relates generally to sensor systems, and specifically to phase detection in an atomic sensing system.

BACKGROUND

An atomic sensing device, such as an atomic magnetometer or a nuclear magnetic resonance (NMR) gyroscope, can include alkali metal particles that precess within an enclosed body in response to an applied magnetic field to allow a parameter associated with a sensitive axis to be measured. As an example, an NMR gyroscope can measure an angular rotation about a sensitive axis, and an atomic magnetometer can be configured to measure the magnitude of one or more external magnetic fields along two orthogonal axes. The value of the measured parameter associated with the sensitive axis can be based on a relative angular alignment between the sensitive axis and a physical axis of the atomic sensing device.

SUMMARY

One embodiment of the invention includes an atomic sensing system. The system includes an atomic sensing device configured to generate an output signal along an output axis in response to a plurality of control parameters. The system also includes a signal generator configured to apply a reference signal to a cross-axis that is approximately orthogonal to the output axis. The system also includes a phase measurement system configured to demodulate the output signal relative to the reference signal to measure a relative phase alignment between the output axis and a physical axis of the atomic sensing device based on the reference signal.

Another embodiment of the invention includes a method for controlling a relative phase alignment between an output axis and a physical axis of an atomic sensing device. The method includes setting a plurality of control parameters associated with the atomic sensing device to generate an output signal along the output axis and providing a reference signal to a physical cross-axis that is approximately orthogonal to the output axis. The method also includes demodulating the output signal based on a demodulation channel associated with the reference signal to measure a relative phase alignment between the output axis and the physical axis. The method further includes controlling the relative phase alignment between the output axis and the physical axis based on the measured relative phase alignment.

Another embodiment of the invention includes an atomic sensing system. The system includes an atomic sensing device configured to generate an output signal along an output axis in response to a plurality of control parameters. The system also includes a signal generator configured to apply an AC magnetic field to a cross-axis that is approximately orthogonal to the output axis. The system further includes a phase measurement system configured to demodulate the output signal based on a demodulation channel associated with a frequency of the AC magnetic field to measure and control a relative phase alignment between the output axis and a physical axis of the atomic sensing device.

DETAILED DESCRIPTION

Figure 1:
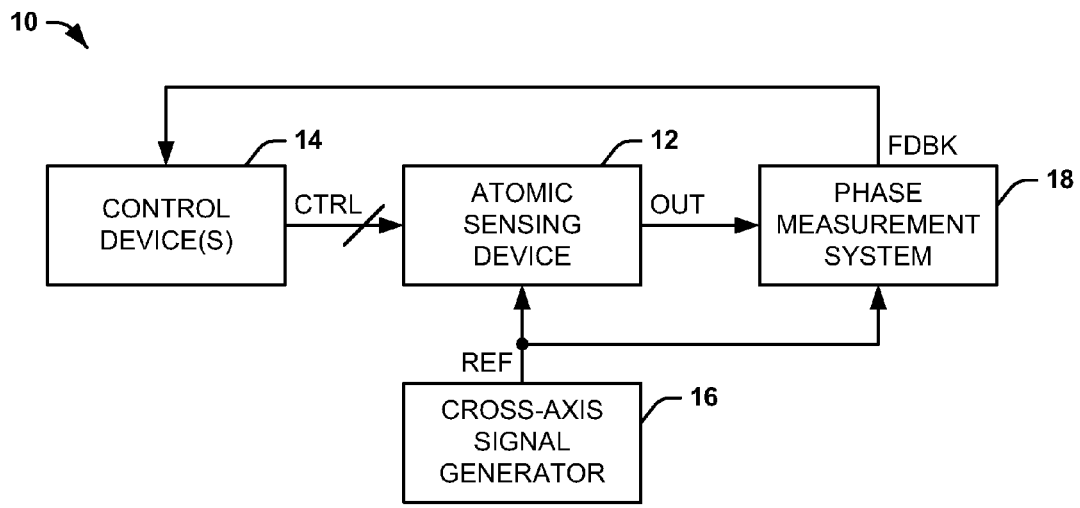
FIG. 1 illustrates an example of an atomic sensing system in accordance with an aspect of the invention.

The present invention relates generally to sensor systems, and specifically to phase detection in an atomic sensing system. An atomic sensing device, such as an atomic magnetometer or a nuclear magnetic resonance (NMR) gyroscope, can generate an output signal corresponding to a measurable parameter at an output axis in response to an applied AC magnetic field that is provided along an axis that is approximately orthogonal to the output axis. As an example, the output axis can include one or both sensitive axes of an atomic magnetometer, or can be an axis orthogonal to the sensitive axis of an NMR gyroscope. The output signal can thus be indicative of either a magnitude of an external magnetic field in the case of an atomic magnetometer, or can be indicative of an angular rotation of an NMR gyroscope.

The value of the measurable parameter can be based on a relative phase angle between the output axis and a physical axis of the atomic sensing device. As described herein, the physical axis of the atomic sensing device can correspond to a physical geometric axis of the atomic sensing device that is exactly collinear with the output axis at an exactly zero-degree phase alignment between the output axis and the physical axis. Thus, as described herein, the relative phase angle between the sensitive axis and the physical axis of the atomic sensing device corresponds to a relative angular alignment between the output axis, as perceived based on a carrier of the output signal, and the corresponding physical geometric axis of the atomic sensing device. A phase misalignment between the output axis and the physical axis can result from any of a variety of factors, including one or more control parameters that are implemented to generate and/or measure the output signal. Thus, a phase misalignment of the output axis and the physical axis of the atomic sensing device can result in an error in the value of the measurable parameter that is determined based on the output signal.

As an example, for an NMR gyroscope, the stability of the sensitive axis can be important to avoid contamination of measured relevant signals by the magnetic fields used to drive the precession of one or more nuclear isotopes, which can cause undesired noble gas signal phase changes and shift the measured angular output of the gyroscope. As another example, for an atomic magnetometer (e.g., an atomic vector magnetometer), the sensitive axis direction can be important to the accuracy and stability of the measured magnetic field magnitude and direction. Thus, the atomic sensing system described herein can be configured to control the relative phase angle between the output axis and the physical axis of the atomic sensing device. For example, the atomic sensing system can be configured to substantially mitigate a relative phase angle misalignment between the output axis and the physical axis of the atomic sensing device to provide for a greater accuracy in determining the measurable parameter.

At least one cross-axis signal generator can be configured to apply a reference signal at a cross-axis that is approximately orthogonal to the output axis of the atomic sensing device. As an example, the reference signal can be an AC magnetic field signal. Thus, because the reference signal is provided approximately orthogonal to the output axis, the reference signal can provide a slight AC magnetic field signal component to the output signal in the event of a phase misalignment between the output axis and the physical axis of the atomic sensing device. A phase measurement system can be configured to receive the output signal and to demodulate the output signal relative to the reference signal. As an example, the demodulation can be based on the stable frequency and phase of the reference signal. Therefore, a resulting demodulated DC value can indicate the phase misalignment between the output axis and the physical axis. Accordingly, the phase measurement system can be configured to adjust at least one of the plurality of control parameters of the atomic sensing system to control the relative phase alignment between the output axis and the physical axis of the atomic sensing device.

FIG. 1 illustrates an example of an atomic sensing system 10 in accordance with an aspect of the invention. The atomic sensing system 10 can be implemented in any of a variety of applications. As an example, the atomic sensing system 10 can be a nuclear magnetic resonance (NMR) gyroscope system that can be implemented in navigation systems for aircraft and/or spacecraft. As another example, the atomic sensing system 10 can be an atomic magnetometer system that can be implemented for measuring magnitude and direction of external magnetic fields.

The atomic sensing system 10 includes an atomic sensing device 12 that is configured to determine a measurable parameter based on an output signal OUT. As an example, the atomic sensing device 12 can be configured as an NMR gyroscope configured to measure an angular rotation or as an atomic magnetometer configured to measure a magnetic field. The atomic sensing device 12 can include an alkali metal, such as Rubidium (Rb) or Cesium (Cs) vapor, that can be configured to precess in response to an applied AC magnetic field. Additionally, in the example of the atomic sensing device 12 being configured as an NMR gyroscope, the atomic sensing device 12 can additionally include one or more gyromagnetic isotopes, such as noble gas isotopes $^3$Helium, $^{83}$Krypton, $^{129}$Xenon, and/or $^{131}$Xenon. The atomic sensing system 10 also includes at least one control device 14 that is configured to generate a respective at least one control parameter, demonstrated in the example of FIG. 1 by the signal CTRL. For example, the control device(s) 14 can include an AC magnetic field generator, a probe laser, a pump laser, and/or any of a variety of additional components that are configured to cooperate with the atomic sensing device 12 to allow the measurable parameter to be determined by the atomic sensing system 10.

The output signal OUT can be provided from the atomic sensing device 12 at an output axis. As an example, for the atomic sensing device 12 being configured as an atomic magnetometer, the output signal OUT can be provided at a sensitive axis of the atomic sensing device 12 and can correspond to an AC signal having a carrier with an amplitude that is proportional to a measured magnetic field. However, in response to any of a variety of factors, the output axis can be substantially out of phase alignment with respect to a physical axis of the atomic sensing device 12. As an example, one or more of the control parameters CTRL can cause a phase shift of the carrier of the output signal OUT, and thus a substantial phase misalignment between the output axis along which the output signal OUT is provided and a corresponding approximately collinear physical axis of the atomic sensing device 12. Accordingly, the measurable parameter that can be determined based on the output signal OUT can be substantially inaccurate based on the phase misalignment between the output axis and the physical axis. Thus, it may be desirable to substantially mitigate or otherwise control the phase misalignment between the output axis and the physical axis.

The atomic sensing system 10 also includes at least one cross-axis signal generator 16 that is configured to apply a reference signal REF at a cross-axis of the atomic sensing device 12, with the cross-axis being approximately parallel with a physical axis and approximately orthogonal to the output axis. Specifically, the cross-axis signal generator 16 can be arranged to provide the reference signal REF approximately orthogonal to the physical axis of the atomic sensing device 12, and thus approximately orthogonal to the output axis along which the output signal OUT is provided. The reference signal REF can be provided as a substantially low-frequency AC magnetic field, such as less than 1000 Hz (e.g., 350 Hz) in a controlled manner. As an example, the cross-axis signal generator 16 can be configured to substantially constantly inject the reference signal REF, or can be configured to periodically inject the reference signal REF. Based on the injection of the reference signal REF at the cross-axis substantially orthogonal to the output axis, a phase misalignment between the output axis and the physical axis can result in a substantially small-amplitude AC component of the reference signal REF being included in the output signal OUT along the output axis.

Figure 2:
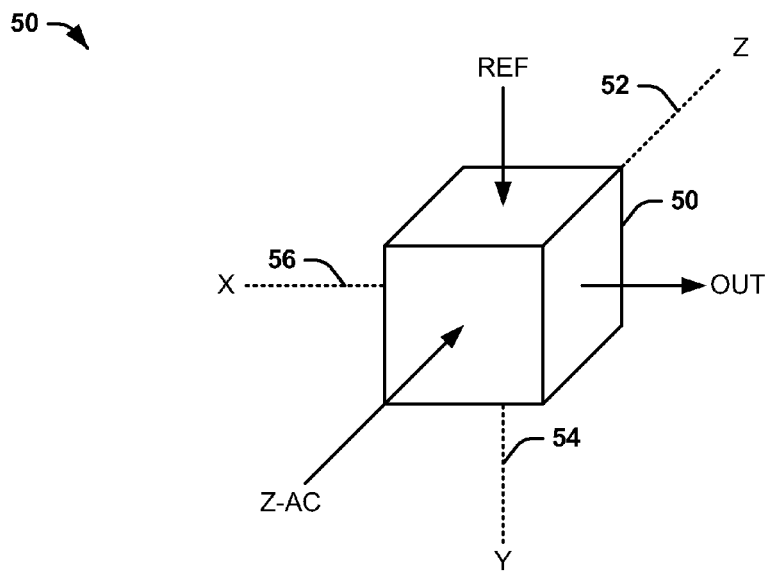
FIG. 2 illustrates an example of an atomic sensing device in accordance with an aspect of the invention.

FIG. 2 illustrates an example of an atomic sensing device 50 in accordance with an aspect of the invention. The atomic sensing device 50 can correspond to the atomic sensing device 12 in the example of FIG. 1. Therefore, in the following discussion of the example of FIG. 2, reference is to be made to the example of FIG. 1. In addition, it is to be understood that the atomic sensing device 50 is demonstrated as substantially cubic by example only, such that the atomic sensing device 12 can be any of a variety of shapes.

The atomic sensing device 50 is demonstrated as receiving an AC magnetic field Z-AC along a Z-axis 52. As an example, the AC magnetic field Z-AC can correspond to one of the control parameters CTRL in the example of FIG. 1. For example, the AC magnetic field Z-AC can include both a DC component and a substantially high AC component, such as being generated as an AC magnetic field having a DC offset. As an example, the AC component of the AC magnetic field Z-AC can have a frequency that is substantially greater than both the reference signal REF and the frequency of the carrier of the output signal OUT. The AC magnetic field Z-AC can be configured to allow alkali metal particles within the atomic sensing device 50 to precess, such that the measurable parameter can be determined based on the output signal OUT.

In the example of FIG. 2, the reference signal REF is also provided to the atomic sensing device 50 along a Y-axis 54. In addition, the output signal OUT is provided from the atomic sensing device 50 along an X-axis 56, which thus likewise corresponds to the physical axis of the atomic sensing device 50. Therefore, in the example of FIG. 2, all three of the AC magnetic field Z-AC, the reference signal REF, and the output signal OUT propagate at approximate orthogonal directions relative to each other. It is to be understood, however, that the output signal OUT could be provided from the atomic sensing device 50 along the Z-axis 52 instead of the X-axis 56, such that it is substantially collinear with the AC magnetic field Z-AC. In this example, the reference signal REF could thus be provided along either the X-axis 56 or the Y-axis 54, as both of these axes 54 and 56 are orthogonal to the Z-axis 52. Thus, the atomic sensing device 50 is not intended to be limited to as demonstrated in the example of FIG. 2.

In the example of FIG. 2, the reference signal REF and the output signal OUT are demonstrated as being provided on orthogonal axes with respect to each other, such that the reference signal REF is likewise provided approximately orthogonally with respect to the physical axis of the atomic sensing device 50 (i.e., the X-axis 56). Thus, if the reference signal REF was provided exactly collinearly with the Y-axis 54 and the output signal OUT was provided exactly collinearly with the X-axis 56, such that the reference signal REF and the output signal OUT were exactly orthogonal with respect to each other, the output signal OUT would be unaffected by the reference signal REF. However, a phase misalignment between the output axis along which the output signal OUT is provided and the physical axis of the atomic sensing device 50 can result in the reference signal REF and the output signal OUT not having an exact orthogonal phase. Such phase misalignment between the between the output axis and the physical axis can result from any of a variety of factors, including characteristics of the control parameters CTRL, such as an amplitude of the AC magnetic field Z-AC. As a result, the output signal OUT can be affected by the reference signal REF, such as by exhibiting a low-amplitude AC component corresponding to the reference signal REF.

Referring back to the example of FIG. 1, the atomic sensing system 10 further includes a phase measurement system 18. The phase measurement system 18 can be configured to receive and demodulate the output signal OUT based on the reference signal REF to measure and/or control a relative phase alignment between the output axis and the physical axis of the atomic sensing device 12. As an example, the phase measurement system 18 can be configured to demodulate the output signal OUT based on the stable and controllable frequency of the reference signal REF to determine the presence and magnitude of an AC component corresponding to the reference signal REF in the output signal OUT.

The presence of the AC component corresponding to the reference signal REF in the output signal OUT can thus correspond to a phase misalignment between the output axis and the physical axis of the atomic sensing device 12, as described above in the example of FIG. 2. As a result, the phase measurement system 18 can generate a feedback signal FDBK that is provided to the control device(s) 14 to adjust the control parameters CTRL, and thus the phase alignment between the output axis and the physical axis. As an example, the control parameters CTRL can be adjusted to substantially remove the AC component corresponding to the reference signal REF from the output signal OUT, such that the phase misalignment between the output axis and the physical axis is substantially mitigated. As another example, the control parameters CTRL can be adjusted to deliberately rotate the phase alignment between the output axis and the physical axis, such as to control an orientation of the sensitive axis of the atomic sensing device 12. As yet another example, the feedback signal FDBK can be implemented to adjust a phase of a demodulation channel associated with the reference signal REF in the phase measurement system 18 to programmably control the relative phase alignment of the output axis relative to the physical axis based on the measured relative phase alignment, or to create one or more additional output axes of the atomic sensing device 12. Therefore, the atomic sensing system 50 can be configured to control the phase alignment between the output axis and the physical axis to provide for accurate and controllable determination of the measurable parameter corresponding to the atomic sensing device 12.

In addition to providing the reference signal REF at the cross-axis to implement phase measurement and/or control, the cross-axis signal generator 16 can be configured to generate additional signals having respective multiple reference frequencies that can be applied to each axis of the atomic sensing device 12. As an example, the additional signals can be implemented for enhanced control over the orthogonality of the axes of the atomic sensing device 12, such as based on a specific frequency that is separate from the frequency of the reference signal REF. As another example, the additional signals having the respective multiple frequencies can be implemented to determine a frequency dependence of the alignment of one or more of the axes of the atomic sensing device 12. Therefore, the atomic sensing system 10 can be configured in a variety of ways.

Figure 3:
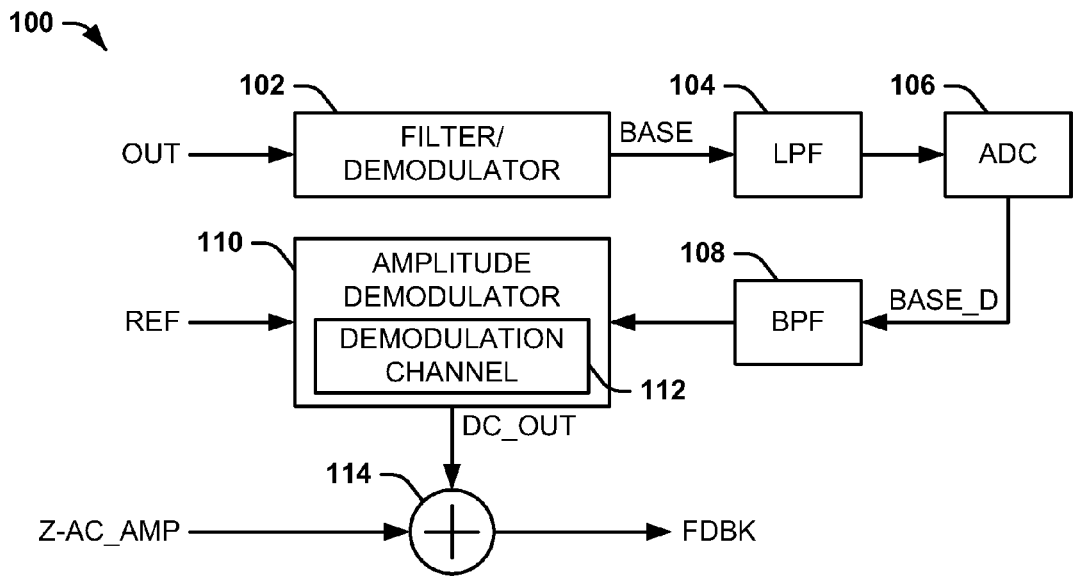
FIG. 3 illustrates an example of a phase measurement system in accordance with an aspect of the invention.

FIG. 3 illustrates an example of a phase measurement system 100 in accordance with an aspect of the invention. The phase measurement system 100 can correspond to the phase measurement system 18 in the example of FIG. 1. Thus, reference is to be made to the example of FIG. 1 in the following description of the example of FIG. 3.

The phase measurement system 100 includes a filter/demodulator 102 that receives the output signal OUT. The filter/demodulator 102 is thus configured to provide band-pass filtering of the output signal OUT and to demodulate the output signal OUT to remove the carrier from the output signal OUT. As an example, the carrier of the output signal OUT can have a frequency that is less than 1 MHz (e.g., approximately 220 kHz), and thus the filter/demodulator 102 can be configured to operate at the appropriate frequency to remove the carrier from the output signal OUT. The resulting baseband signal BASE is then provided to a low-pass filter (LPF) 104 to substantially remove high-frequency components. The filtered baseband signal BASE is then provided to an analog-to-digital converter (ADC) 106 that converts the filtered baseband signal BASE to the digital domain. The resulting digital baseband signal BASE_D is then band-pass filtered by a digital band-pass filter (BPF) 108.

The phase measurement system 100 also includes an amplitude demodulator 110 that is configured to demodulate the band-pass filtered digital baseband signal BASE_D based on the reference signal REF. Specifically, the amplitude demodulator 110 can generate a demodulation channel 112 based on the reference signal REF, such that the demodulation channel 112 can be used to demodulate the digital baseband signal BASE_D at the same phase and frequency as the reference signal (e.g., approximately 350 Hz). As a result, an AC component in the output signal OUT is output from the amplitude demodulator 110 as a DC signal DC_OUT. Specifically, the output signal OUT can have an AC component resulting from injection of the reference signal REF at the cross-axis of the atomic sensing device 12 orthogonal to the output axis while the output axis is phase misaligned relative to the physical axis of the atomic sensing device 12. Therefore, the AC component resulting from the reference signal REF can thus be exhibited as the DC signal DC_OUT in response to demodulation of the baseband signal BASE associated with the output signal OUT based on the reference signal REF itself. Accordingly, the magnitude of the DC signal DC_OUT can correspond directly to an amount of phase misalignment between the output axis along which the output signal OUT is provided and the physical axis of the atomic sensing device 12. As a result, an approximately zero magnitude of the DC signal DC_OUT can be indicative of approximately zero phase misalignment between the output axis and the physical axis.

As described above in the example of FIG. 1, phase misalignment between the output axis and the physical axis can result from one or more of the control parameters CTRL. Therefore, one or more of the control parameters CTRL can be adjusted to control the relative phase alignment between the output axis and the physical axis. In the example of FIG. 3, the phase measurement system 100 is configured to adjust an amplitude of the AC magnetic field Z_AC, demonstrated in the example of FIG. 3 as Z-AC_AMP. Specifically, the AC magnetic field amplitude Z-AC_AMP and the DC signal DC_OUT are each provided to a summer 114, such that the magnitude of the DC signal DC_OUT corresponding to the phase alignment between the output axis and the physical axis adjusts the magnitude of the AC magnetic field amplitude Z-AC_AMP. Therefore, the summer 114 provides the feedback signal FDBK which is provided to the control device(s) 14 as an error signal in a feedback manner to adjust the AC magnetic field amplitude Z-AC_AMP. Accordingly, in the example of FIG. 3, the phase measurement system 100 is configured to adjust the AC magnetic field amplitude Z-AC_AMP to substantially mitigate the phase misalignment between the output axis and the physical axis of the atomic sensing device 12. As a result, the atomic sensing device 12 can be substantially stabilized for accurate determination of the measurable parameter.

It is to be understood that the phase measurement system 100 is not intended to be limited to the example of FIG. 3. As an example, the phase measurement system 100 is not limited to implementing the amplitude demodulator 110 in the digital domain, but could instead implement the amplitude demodulator 110 in the analog domain, such that the ADC 106 can be omitted. As another example, while the example of FIG. 3 demonstrates adjustment of the AC magnetic field amplitude Z-AC_AMP to control the phase alignment between the output axis and the physical axis, the phase measurement system 100 could instead control one or more other control parameters CTRL instead of or in addition to the AC magnetic field amplitude Z-AC_AMP. As an example, the phase measurement system 100 could instead or additionally control temperature of the atomic sensing device 12, at least one of an intensity and a wavelength of an associated probe laser, at least one of an intensity and a wavelength of an associated pump laser, or a combination therein.

In addition, the phase measurement system 100 is not limited to generating the feedback signal FDBK as an error signal for control of the respective control parameter(s) CTRL, as demonstrated in the example of FIG. 3. As an example, the phase measurement system 100 can instead implement a dither lock system to determine the approximate null value of the DC signal DC_OUT corresponding to the approximate phase alignment between the output axis and the physical axis. For example, the phase measurement system 100 and/or the control device(s) 14 can cooperate to adjust the value of the control parameter(s) CTRL (e.g., the AC magnetic field amplitude Z-AC_AMP) over a dither cycle and can monitor the demodulated value of the output signal OUT (e.g., the DC signal DC_OUT) over the dither cycle. Thus, the phase measurement system 100 can gather data associated with the demodulated value of the output signal OUT over the dither cycle to ascertain an approximate phase relationship between the output axis and the physical axis based on the accumulated data set.

Furthermore, it is to be understood that the phase measurement system 100 is not limited to simply mitigating the phase misalignment between the output axis and the physical axis of the atomic sensing device 12, but could instead actively control and/or manipulate the phase alignment between the output axis and the physical axis. As an example, instead of providing the feedback signal FDBK to the control device(s) 14 to modify the control parameter(s) CTRL to stabilize the phase relationship between the output axis and the physical axis, the phase measurement system 100 could include a controller (not shown) that directly monitors the DC signal DC_OUT. The controller could then actively adjust the control parameter(s) CTRL, or actively shift the phase of the demodulation channel 112, based on a desired value of the DC signal DC_OUT to increase or decrease the phase alignment between the output axis and the physical axis. As a result, the phase measurement system 100 could provide programmable control over the phase relationship between the output axis and the physical axis, such as to modify a sensitive axis of the atomic sensing device 12 or create one or more additional sensitive axes of the atomic sensing device 12.

Figure 4:
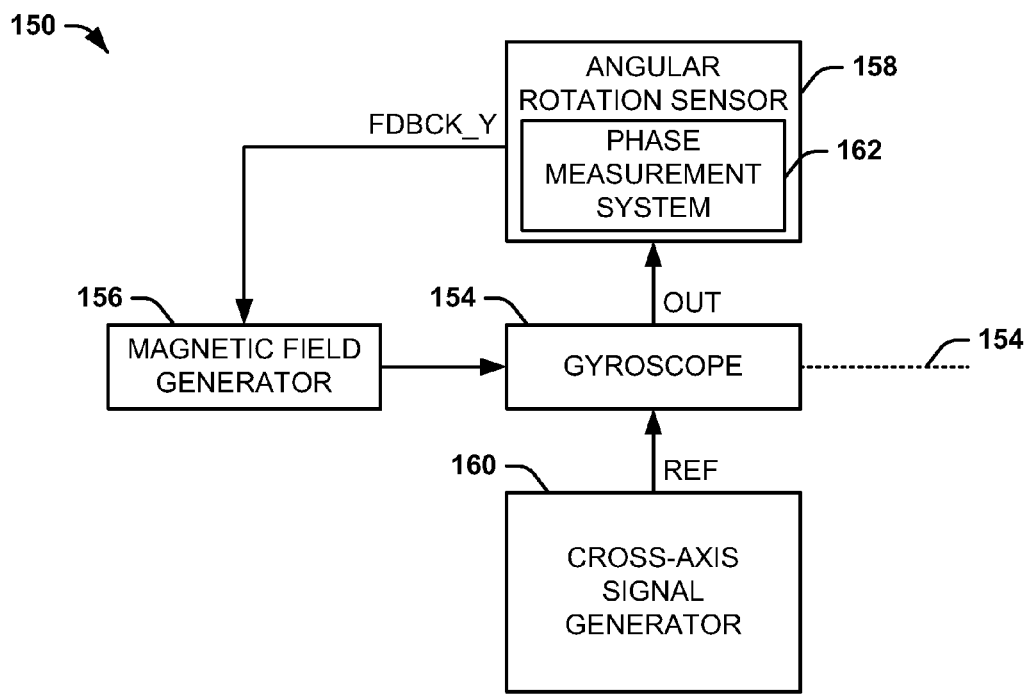
FIG. 4 illustrates an example of a gyroscope system in accordance with an aspect of the invention.

FIG. 4 illustrates an example of a gyroscope system 150 in accordance with an aspect of the invention. The gyroscope system 150 can be configured as an NMR gyroscope system that can correspond to the atomic sensing system 10 in the example of FIG. 1. Specifically, the gyroscope system 150 can be configured to measure a rotation angle $\theta_G$ about a sensitive axis 152. Thus, the gyroscope system 150 can be implemented in navigation systems for aircraft and/or spacecraft, and/or as part of a multi-axis gyroscope system. Therefore, reference is to be made to the examples of FIGS. 1 through 3 in the following description of the example of FIG. 4.

The gyroscope system 150 includes a gyroscope 154 that is configured to measure an angular rotation about a sensitive axis 152 based on an output signal OUT. The output signal OUT can be considered to be provided from the gyroscope 154 along an output axis. The gyroscope 154 can include an alkali metal, such as Rubidium (Rb) or Cesium (Cs) vapor, that can be configured to precess in response to an AC magnetic field Z-AC generated by a magnetic field generator 156. As an example, the magnetic field generator 156 can be configured as a magnetic solenoid that substantially surrounds the gyroscope 154. The magnetic field generator 156 can thus correspond to one of the control device(s) 14 in the example of FIG. 1, such that the AC magnetic field Z-AC can correspond to one of the respective control parameter(s) CTRL. Additionally, the gyroscope 154 can additionally include one or more gyromagnetic isotopes, such as noble gas isotopes $^3$Helium, $^{83}$Krypton, $^{129}$Xenon, and/or $^{131}$Xenon. Two of the gyromagnetic isotopes can precess in opposite directions with respect to each other, and can interact with the alkali metal that is pumped by a pump laser in a spin-exchange process, such that the output signal OUT can correspond to the measurable precession of the alkali metal as it interacts with the gyromagnetic isotopes. Accordingly, the angular of rotation of the gyroscope 154 about the sensitive axis 152 can be determined by an angular rotation sensor 158 based on the measured precession of the alkali metal, as ascertained by the output signal OUT. It is to be understood that the angular rotation sensor 158 can include a variety of components that can be necessary for determining the angular rotation rate, such as a pump laser, a probe laser, photodetectors, a signal processor, and/or a variety of additional control components.

Similar to as described above in the example of FIG. 1, in response to any of a variety of factors, the output axis can be substantially out of phase alignment with respect to a corresponding physical axis of the gyroscope 154. As an example, the amplitude of the magnetic field Z-AC, as well as any of a variety of other factors, can cause a phase shift of the carrier of the output signal OUT, and thus a substantial phase misalignment between the output axis along which the output signal OUT is provided and the corresponding physical axis of the gyroscope 154. Accordingly, the angular rotation of the gyroscope 154 that can be determined based on the output signal OUT can be substantially inaccurate based on the phase misalignment between the output axis and the physical axis.

In the example of FIG. 4, the gyroscope system 150 also includes a cross-axis signal generator 160 that is configured to apply a reference signal REF at a cross-axis of the gyroscope 154, with the cross-axis being approximately orthogonal to the output axis. Specifically, the cross-axis signal generator 160 can be arranged to provide the reference signal REF approximately orthogonal to the physical axis of the gyroscope 154, and thus approximately orthogonal to the output axis along which the output signal OUT is provided. While the reference signal REF and the output signal OUT appear in the example of FIG. 4 to be coplanar, it is to be understood that such demonstration is for simplicity only, and that the output signal OUT and the reference signal REF are orthogonal with respect to each other. Therefore, based on the injection of the reference signal REF at the cross-axis substantially orthogonal to the output axis, a phase misalignment between the output axis and the physical axis can result in a substantially small-amplitude AC component of the reference signal REF being included in the output signal OUT along the output axis.

In the example of FIG. 4, the angular rotation sensor 158 includes a phase measurement system 162. The phase measurement system 162 can be configured to receive and demodulate the output signal OUT based on the reference signal REF to determine and/or control a phase misalignment between the output axis and the physical axis of the gyroscope 154, similar to as described above in the example of FIG. 3. Specifically, the presence of the AC component corresponding to the reference signal REF in the output signal OUT can thus correspond to a phase misalignment between the output axis and the physical axis of the gyroscope 154. As a result, the phase measurement system 162 can generate a feedback signal FDBK that is provided to the magnetic field generator 156 to adjust the amplitude of the AC magnetic field Z-AC, and thus the phase alignment between the output axis and the physical axis. As an example, the amplitude of the AC magnetic field Z-AC can be adjusted to substantially remove the AC component corresponding to the reference signal REF from the output signal OUT, such that the phase misalignment between the output axis and the physical axis is substantially mitigated. As another example, the amplitude of the AC magnetic field Z-AC can be adjusted to deliberately rotate the phase alignment between the output axis and the physical axis, such as to control an orientation of the sensitive axis 152 of the gyroscope 154. Therefore, the phase measurement system 162 can be configured to control the phase alignment between the output axis and the physical axis to provide for accurate and controllable determination of the angular rotation about the sensitive axis 152 of the gyroscope 154.

It is to be understood that the gyroscope system 150 is not intended to be limited to the example of FIG. 4. As an example, the gyroscope system 150 is demonstrated in the example of FIG. 4 and described herein very simplistically, such that a variety of additional components and technical details have been omitted in the example of FIG. 4. In addition, it is to be understood that the orientation of the gyroscope 154 with respect to the sensitive axis 152, the output axis along which the output signal OUT is provided, and the cross-axis along which the reference signal REF is injected are demonstrated by example, and that other relative orientations of the respective axes can be implemented with the output axis and the cross-axis remaining orthogonal. Therefore, the gyroscope system 150 can be configured in any of a variety of ways.

Figure 5:
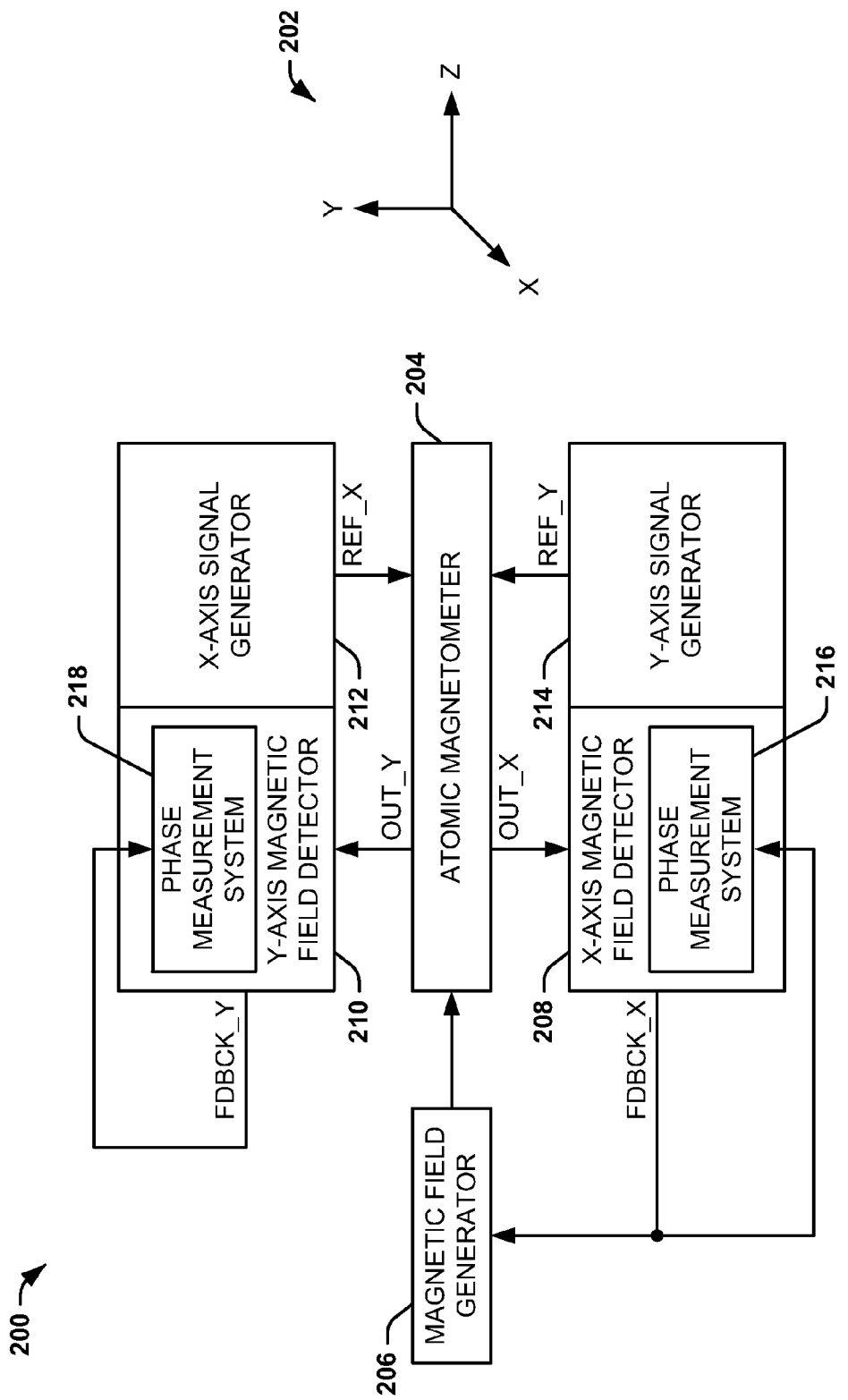
FIG. 5 illustrates an example of a magnetometer system in accordance with an aspect of the invention.

FIG. 5 illustrates an example of a magnetometer system 200 in accordance with an aspect of the invention. The atomic magnetometer system 200 can be configured to measure an amplitude and/or direction of an external magnetic field about each of a pair of orthogonal sensitive axes, demonstrated as the X- and Y-axes by the Cartesian coordinate system at 202. The atomic magnetometer system 200 can thus be configured substantially similar to the atomic sensing system 10 in the example of FIG. 1. Therefore, reference is to be made to the examples of FIGS. 1 through 3 in the following description of the example of FIG. 5.

The atomic magnetometer system 200 includes an atomic magnetometer 204 that is configured to measure magnetic fields about the X and Y sensitive axes based on respective output signals OUT_X and OUT_Y. The output signals OUT_X and OUT_Y can be considered to be provided from the atomic magnetometer 204 along output axes that correspond to the respective sensitive axes in the X- and Y-axes. The atomic magnetometer 204 can include an alkali metal, such as Rubidium (Rb) or Cesium (Cs) vapor, that can be configured to precess in response to an AC magnetic field Z-AC generated by a magnetic field generator 206. As an example, the magnetic field generator 206 can be configured as a magnetic solenoid that substantially surrounds the atomic magnetometer 204. The magnetic field generator 206 can thus correspond to one of the control device(s) 14 in the example of FIG. 1, such that the AC magnetic field Z-AC can correspond to one of the respective control parameter(s) CTRL. The amplitude and direction of external magnetic fields can be determined by an X-axis magnetic field detector 208 and a Y-axis magnetic field detector 210 based on the measured precession of the alkali metal, as ascertained by the output signals OUT_X and OUT_Y, respectively. It is to be understood that each of the X- and Y-axis magnetic field detectors 208 and 210 can include a variety of components that can be necessary for determining the angular rotation, such as a pump laser, a probe laser, photodetectors, a signal processor, and/or a variety of additional control components.

Similar to as described above in the example of FIG. 1, in response to any of a variety of factors, the output axes can be substantially out of phase alignment with respect to a corresponding physical axes of the atomic magnetometer 204. Thus, the orthogonal phase orientations between the respective output axes can likewise deviate. As an example, the amplitude of the magnetic field Z-AC, as well as any of a variety of other factors, can cause a phase shift of the carrier of the output signals OUT_X and OUT_Y, and thus a substantial phase misalignment between the respective X and Y output axes along which the output signals OUT_X and OUT_Y are provided and the corresponding respective X and Y physical axes of the atomic magnetometer 204. Accordingly, external magnetic fields that can be determined by the atomic magnetometer system 200 based on the output signals OUT_X and OUT_Y can be substantially inaccurate based on the phase misalignment between the output axes and the respective physical axes.

In the example of FIG. 5, the atomic magnetometer system 200 also includes an X-axis signal generator 212 that is configured to apply a reference signal REF_X along the X-axis of the atomic magnetometer 204 and a Y-axis signal generator 214 that is configured to apply a reference signal REF_Y along the Y-axis of the atomic magnetometer 204. While the reference signals REF_X and REF_Y and the output signals OUT_X and OUT_Y appear in the example of FIG. 5 to be coplanar, it is to be understood that such demonstration is for simplicity only, and that the output signal OUT_X and the reference signal REF_Y are orthogonal with respect to each other, as are the output signal OUT_Y with respect to the reference signal REF_X. Therefore, based on the injection of the reference signal REF_X substantially orthogonal to the Y output axis along which the respective output signal OUT_Y is generated, a phase misalignment between the Y output axis and the Y physical axis can result in a substantially small-amplitude AC component of the reference signal REF_X being included in the output signal OUT_Y. Likewise, based on the injection of the reference signal REF_Y substantially orthogonal to the X output axis along which the respective output signal OUT_X is generated, a phase misalignment between the X output axis and the X physical axis can result in a substantially small-amplitude AC component of the reference signal REF_Y being included in the output signal OUT_X.

In the example of FIG. 5, the X-axis signal generator 212 includes a phase measurement system 216 and the Y-axis signal generator 214 includes a phase measurement system 218. The phase measurement system 216 can be configured to receive and demodulate the output signal OUT_X based on the reference signal REF_Y to determine and/or control a phase misalignment between the X output axis and the X physical axis of the atomic magnetometer 204, similar to as described above in the example of FIG. 3. Similarly, the phase measurement system 218 can be configured to receive and demodulate the output signal OUT_Y based on the reference signal REF_X to determine and/or control a phase misalignment between the Y output axis and the Y physical axis of the atomic magnetometer 204.

In the example of FIG. 5, the phase measurement system 216 can generate a feedback signal FDBK_X that is provided to the magnetic field generator 206 to adjust the amplitude of the AC magnetic field Z-AC, and thus the phase alignment between the X output axis and the X physical axis. As an example, the amplitude of the AC magnetic field Z-AC can be adjusted to substantially remove the AC component corresponding to the reference signal REF_Y from the output signal OUT_X, such that the phase misalignment between the X output axis and the X physical axis is substantially mitigated. However, an adjustment to the amplitude of the AC magnetic field Z-AC may also change the relative phase alignment between the Y output axis and the Y physical axis. As an example, adjusting the amplitude of the AC magnetic field Z-AC to substantially phase align the X output axis and the X physical axis may result in phase misalignment of the Y output axis and the Y physical axis. In other words, adjusting the amplitude of the AC magnetic field Z-AC alone may be insufficient to phase align both the X and Y output axes with the respective X and Y physical axes.

In the example of FIG. 5, the phase measurement system 218 can generate a feedback signal FDBK_Y that is fed back to the phase measurement system 218. The feedback signal FDBK_Y can thus be implemented to adjust a phase of the demodulation channel 112 of the amplitude demodulator 110, as demonstrated in the example of FIG. 3, in the phase measurement system 218. As a result, when the amplitude demodulator 110 demodulates the digital baseband output signal BASE_D based on the reference signal REF_X, the phase of the demodulation channel 112 can be adjusted via the feedback signal FDBK_Y to set the DC signal DC_OUT to approximately zero. Therefore, upon the phase measurement system 216 adjusting the amplitude of the AC magnetic field Z-AC to substantially phase align the X output axis and the X physical axis, the phase measurement system 218 can adjust the phase of the demodulation channel 112 to substantially zero the DC signal DC. Accordingly, the X and Y output axes are set to be substantially orthogonal to each other, such that the X and Y output axes are both phase aligned with the respective X and Y physical axes. Thus, the phase measurement systems 216 and 218 can cooperate in the manner described above to substantially mitigate phase misalignment between the X and Y output axes relative to the X and Y physical axes. Alternatively, the phase measurement systems 216 and 218 can cooperate to control the relative phase orientations of the X and Y output axes, such as to independently control the sensitive axes of the atomic magnetometer 204.

It is to be understood that the atomic magnetometer system 200 is not intended to be limited to the example of FIG. 5. As an example, the atomic magnetometer system 200 is demonstrated in the example of FIG. 5 and described herein very simplistically, such that a variety of additional components and technical details have been omitted in the example of FIG. 5. In addition, it is to be understood that the feedback signals FDBK_X and FDBK_Y are not limited to adjusting the amplitude of the AC magnetic field Z-AC and the phase of the demodulation channel 112 of the phase measurement system 218, respectively. As an example, either or both of the feedback signals FDBK_X and FDBK_Y can be implemented to adjust any of a variety of other control parameters. Therefore, the atomic magnetometer system 200 can be configured in any of a variety of ways.

Figure 6:
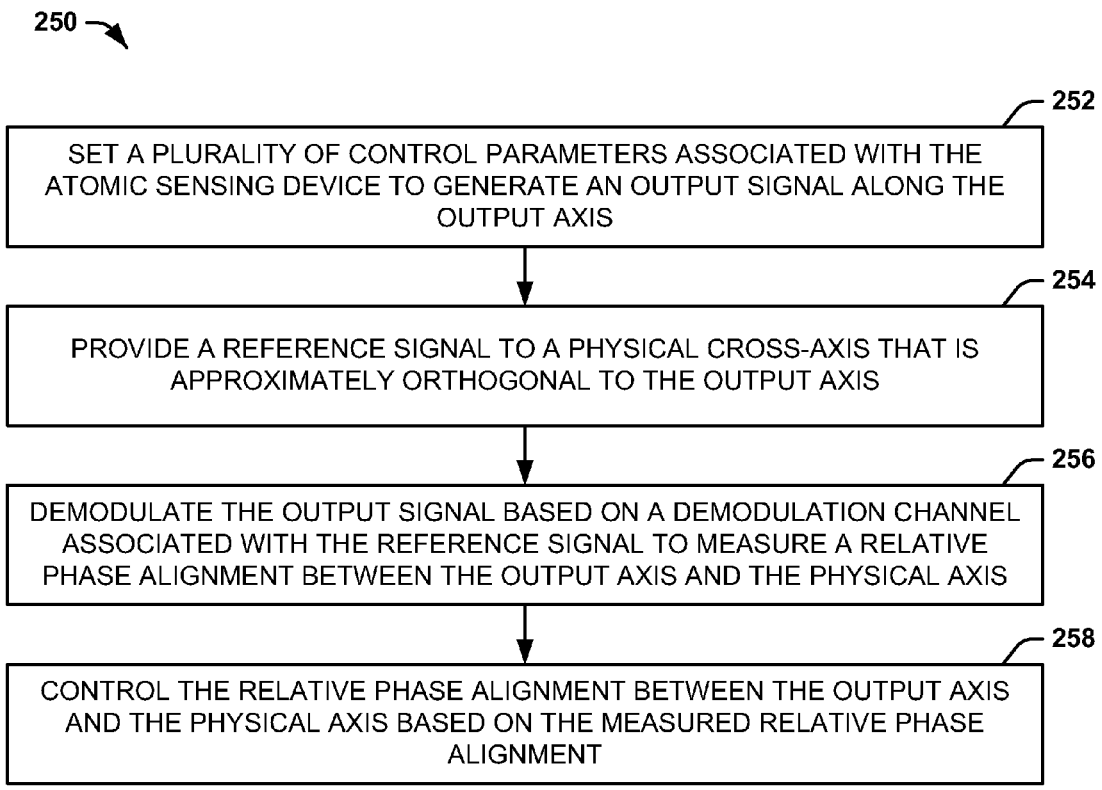
FIG. 6 illustrates an example of a method for controlling a relative phase alignment between an output axis and a physical axis of an atomic sensing device in accordance with an aspect of the invention.

In view of the foregoing structural and functional features described above, a methodology in accordance with various aspects of the present invention will be better appreciated with reference to FIG. 6. While, for purposes of simplicity of explanation, the methodologies of FIG. 6 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for controlling a relative phase alignment between an output axis and a physical axis of an atomic sensing device. At 252, a plurality of control parameters associated with the atomic sensing device are set to generate an output signal along the output axis. The control parameters can include one or more of temperature of the atomic sensing system, at least one of an intensity and a wavelength of a probe laser, at least one of an intensity and a wavelength of a pump laser, and an AC amplitude of a magnetic field that is provided along an axis of the atomic sensing device that is approximately orthogonal to both the output axis and the cross-axis. At 254, a reference signal is provided to a cross-axis that is approximately orthogonal to the output axis. The reference signal can be an AC magnetic field, and can include two AC magnetic fields, each orthogonal to separate sensitive axes, such as in a magnetometer system.

At 256, the output signal is demodulated based on a demodulation channel associated with the reference signal to measure a relative phase alignment between the output axis and the physical axis. The demodulation channel can have a frequency that is the set based on the reference signal to demodulate the output signal at that frequency. At 258, the relative phase alignment between the output axis and the physical axis is controlled based on the measured relative phase alignment. The control can be based on adjusting one or more of the control parameters, or by adjusting a phase of the demodulation channel, such as to substantially minimize a phase misalignment between the output axis and the physical axis of the atomic sensing device.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An atomic sensing system comprising:
   an atomic sensing device configured to generate an output signal along an output axis in response to a plurality of control parameters;
   a signal generator configured to apply a reference signal to the atomic sensing device along a physical cross-axis that is approximately orthogonal to the output axis; and
   a phase measurement system configured to:
      demodulate the output signal relative to the reference signal to measure a relative phase alignment between the output axis and a physical axis of the atomic sensing device based on the reference signal; and
      adjust at least one of the plurality of control parameters to control the relative phase alignment to substantially mitigate a phase misalignment between the output axis and the physical axis of the atomic sensing device.

2. The system of claim 1, wherein the plurality of control parameters comprises temperature of the atomic sensing device, at least one of an intensity and a wavelength of a probe laser, at least one of an intensity and a wavelength of a pump laser, and an AC amplitude of a magnetic field that is provided along an axis of the atomic sensing device that is approximately orthogonal to both the output axis and the physical cross-axis.

3. The system of claim 1, wherein the atomic sensing device is configured as a nuclear magnetic resonance (NMR) gyroscope, such that the phase measurement system is configured to substantially mitigate a phase misalignment between the output axis and the physical axis of the atomic sensing device to substantially mitigate errors in a measured rotation.

4. The system of claim 1, wherein the atomic sensing device is configured as an atomic magnetometer comprising a first sensitive axis and a second sensitive axis that are approximately orthogonal with respect to each other, the atomic sensing device generating a first output signal along the first sensitive axis and a second output signal along the second sensitive axis.

5. The system of claim 4, wherein the signal generator comprises a first signal generator configured to apply a first reference signal along the first sensitive axis and a second signal generator configured to apply a second reference signal along the second sensitive axis, and wherein the phase measurement system is configured to demodulate the first output signal relative to the second reference signal to measure a relative phase alignment between the first sensitive axis and a first physical axis of the atomic magnetometer based on the second reference signal, and to demodulate the second output signal relative to the first reference signal to measure a relative phase alignment between the second sensitive axis and a second physical axis of the atomic magnetometer based on the first reference signal.

6. The system of claim 5, wherein the phase measurement system is further configured to adjust at least one of the plurality of control parameters to control the relative phase alignment of one of the first sensitive axis relative to the first physical axis and the second sensitive axis relative to the second physical axis, and to adjust a phase of a demodulation channel associated with one of the first reference signal and the second reference signal to control the relative phase alignment of the other of the first sensitive axis relative to the first physical axis and the second sensitive axis relative to the second physical axis.

7. The system of claim 1, wherein the signal generator is arranged as at least one signal generator configured to apply a respective at least one AC magnetic field reference signal to a respective at least one physical cross-axis that is approximately orthogonal to the output axis.

8. The system of claim 1, wherein the phase measurement system is further configured to adjust a phase of a demodulation channel associated with the reference signal to one of programmably control the relative phase alignment of the output axis relative to the physical axis based on the measured relative phase alignment and create at least one additional output axis of the atomic sensing device.

9. A method for controlling a relative phase alignment between an output axis and a physical axis of an atomic sensing device, the method comprising:
   setting a plurality of control parameters associated with the atomic sensing device to generate an output signal along the output axis;
   providing a reference signal to the atomic sensing device along a physical cross-axis that is approximately orthogonal to the output axis;
   demodulating the output signal based on a demodulation channel associated with the reference signal to measure a relative phase alignment between the output axis and the physical axis; and
   controlling the relative phase alignment between the output axis and the physical axis based on the measured relative phase alignment.

10. The method of claim 9, wherein controlling the relative phase alignment comprises mitigating a phase misalignment between the output axis and the physical axis of the atomic sensing device.

11. The method of claim 9, wherein controlling the relative phase alignment comprises one of programmably controlling the relative phase alignment of the output axis relative to the physical axis based on the measured relative phase alignment and creating at least one additional output axis of the atomic sensing device.

12. The method of claim 9, wherein controlling the relative phase alignment comprises adjusting at least one of the plurality of control parameters based on the measured relative phase alignment.

13. The method of claim 9, wherein controlling the relative phase alignment comprises programmably adjusting a phase of the demodulation channel.

14. The method of claim 9, wherein providing the reference signal comprises providing at least one AC magnetic field reference signal to the physical cross-axis.

15. The method of claim 9, wherein providing the reference signal comprises providing a plurality of reference signals to a respective plurality of cross-axes that are each orthogonal to a respective one of a plurality of output axes associated with a respective plurality of output signals, wherein demodulating the output signal comprises demodulating each of the plurality of output signals based on a demodulation channel associated with a respective orthogonal one of the plurality of reference signals to measure a relative phase alignment between one of the plurality of output axes and an associated one of a plurality of physical axes, and wherein controlling the relative phase alignment comprises controlling the relative phase alignment between the one of the plurality of output axes and the associated one of the plurality of physical axes based on the measured relative phase alignment.

16. An atomic sensing system comprising:
an atomic sensing device configured to generate an output signal along an output axis in response to a plurality of control parameters;
a signal generator configured to apply an AC magnetic field to the atomic sensing device along a physical cross-axis that is approximately orthogonal to the output axis; and
a phase measurement system configured to demodulate the output signal based on a demodulation channel associated with a frequency of the AC magnetic field to measure and control a relative phase alignment between the output axis and a physical axis of the atomic sensing device.

17. The system of claim 16, wherein the phase measurement system is configured to control the relative phase alignment between the output axis and the physical axis of the atomic sensing device based on adjusting an AC amplitude of a magnetic field that is provided along an axis of the atomic sensing device that is approximately orthogonal to both the output axis and the physical cross-axis.

18. The system of claim 16, wherein the phase measurement system is further configured to adjust a phase of the demodulation channel to programmably control the relative phase alignment of the sensitive axis relative to the physical axis based on the measured relative phase alignment.

19. The system of claim 16, wherein the signal generator comprises a first signal generator configured to apply a first AC magnetic field along a first output axis along which a first output signal is generated and a second signal generator configured to apply a second AC magnetic field along a second output axis along which a second output signal is generated, and wherein the phase measurement system is configured to demodulate the first output signal relative to the second AC magnetic field to measure a relative phase alignment between the first output axis and a first physical axis of the atomic sensing device based on the second AC magnetic field, and to demodulate the second output signal relative to the first AC magnetic field to measure a relative phase alignment between the second output axis and a second physical axis of the atomic sensing device.

* * * * *